(12) United States Patent
Devnani et al.

(10) Patent No.: US 9,166,550 B2
(45) Date of Patent: Oct. 20, 2015

(54) SYSTEM AND METHOD FOR USING A REFERENCE PLANE TO CONTROL TRANSMISSION LINE CHARACTERISTIC IMPEDANCE

(71) Applicant: Avago Technologies General IP (Singapore) Pte. Ltd., Singapore (SG)

(72) Inventors: Nurwati Suwendi Devnani, Fort Collins, CO (US); Lin Wang, Palm Gardens (SG); Regee Petaja, Loveland, CO (US); Mark A. Hinton, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 170 days.

(21) Appl. No.: 13/802,890

(22) Filed: Mar. 14, 2013

(65) Prior Publication Data
US 2014/0266491 A1    Sep. 18, 2014

(51) Int. Cl.
*H03H 7/38* (2006.01)
*H01P 3/08* (2006.01)
*H05K 1/02* (2006.01)

(52) U.S. Cl.
CPC ............ *H03H 7/38* (2013.01); *H05K 1/0253* (2013.01); *H01P 3/085* (2013.01); *H01P 3/088* (2013.01); *H05K 1/0219* (2013.01); *H05K 1/0225* (2013.01); *H05K 1/0245* (2013.01)

(58) Field of Classification Search
CPC ......... H01P 3/003; H01P 3/006; H01P 3/081; H01P 3/082; H01P 3/085; H01P 3/088
USPC ............................................ 333/238, 246, 33
See application file for complete search history.

(56) References Cited

U.S. PATENT DOCUMENTS

| | | | |
|---|---|---|---|
| 4,680,557 A * | 7/1987 | Compton | 333/1 |
| 5,729,183 A * | 3/1998 | Schuchmann et al. | 333/1 |
| 6,885,549 B2 * | 4/2005 | Thomason | 361/679.27 |
| 7,504,904 B1 | 3/2009 | Powers et al. | |
| 7,940,144 B2 * | 5/2011 | Koch et al. | 333/33 |
| 2009/0027144 A1 * | 1/2009 | Saito | 333/238 |
| 2012/0133458 A1 * | 5/2012 | Kato et al. | 333/238 |
| 2012/0234582 A1 | 9/2012 | Karikalan et al. | |

FOREIGN PATENT DOCUMENTS

WO    9736340 A1    10/1997
WO    2011046809 A2    4/2011

OTHER PUBLICATIONS

Controlled Impedance Designs;Viasystems Group, Inc.; pp. 1-4; 2011.

* cited by examiner

*Primary Examiner* — Benny Lee (57) ABSTRACT

A system for using a reference plane to control transmission line characteristic impedance includes a signal trace located in a multi-layer structure and at least one constant thickness reference plane proximate to the signal trace, the constant thickness reference plane located with respect to the signal trace so as to provide a desired characteristic impedance between the signal trace and the constant thickness reference plane.

16 Claims, 8 Drawing Sheets

SYSTEM AND METHOD FOR USING A REFERENCE PLANE TO CONTROL TRANSMISSION LINE CHARACTERISTIC IMPEDANCE

BACKGROUND

A modern application specific integrated circuit (ASIC) must meet very stringent design and performance specifications. One of the factors that influence the design and performance of an ASIC is the characteristic impedance of the transmission lines that are located on a printed circuit board (PCB), interconnect structure, package, or other elements associated with an ASIC. The terms "impedance" and "characteristic impedance" are used interchangeably. Typically, it is desirable to control the characteristic impedance of a transmission line so as to maximize the efficiency of signal transfer in both a single-ended signal application and in a differential signal application. As its name implies, a single-ended signal is one that is transferred using a single transmission line. A differential signal is one that is represented by two complementary signals on different conductors (i.e., transmission lines), with the term "differential" representing the difference between the two complementary signals. A "differential pair" is a communication methodology that uses two separate conductors (i.e., the differential pair) to carry a differential communication signal. All differential signals also have what is referred to as a "common mode," which represents the average of the two differential signals. One of the conductors carries a "true" or "positive" version of the differential communication signal while the other conductor carries the "complement" or "negative" version of the differential communication signal.

Regardless of whether the transmission line or lines are adapted to transfer a single-ended signal or a differential signal, the characteristic impedance of the transmission line is important as it relates to the efficiency of signal transfer.

Existing techniques to control the characteristic impedance include, for example, controlling line width, line spacing, dielectric thickness, dielectric constant, and others. In a strip line signal trace, low crosstalk environment, a high characteristic impedance is achieved by reducing line width, increasing dielectric thickness or changing material properties of the trace and/or dielectric, and adjusting the number of layers of material. Unfortunately, for example, reducing line width results in higher insertion loss and increasing the likelihood of signal crosstalk. These existing techniques all have other drawbacks and may not achieve the desired characteristic impedance.

Therefore, it would be desirable to have a way of controlling the characteristic impedance of a transmission line in an ASIC while maintaining a low insertion loss and low likelihood of signal crosstalk.

SUMMARY

An embodiment of a system for using a reference plane to control transmission line characteristic impedance comprises a signal trace located in a multi-layer structure and at least one constant thickness reference plane proximate to the signal trace, the constant thickness reference plane located with respect to the signal trace so as to provide a desired characteristic impedance between the signal trace and the constant thickness reference plane.

An embodiment of a method for using a reference plane to control transmission line characteristic impedance comprises forming a signal trace; forming at least one constant thickness reference plane proximate to the signal trace, and forming the constant thickness reference plane to provide a desired characteristic impedance between the signal trace and the constant thickness reference plane.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

A system and method for using a reference plane to control transmission line characteristic impedance can be used in any application specific integrated circuit (ASIC) in which it is desirable to control the characteristic impedance of a transmission line.

Controlling the characteristic impedance of a transmission line improves signal-to-noise ratio, improves isolation, lowers insertion loss and reduces cross talk between signal paths. In an embodiment, the system and method for using reference plane dimensions to control transmission line characteristic impedance allows a relatively wider trace width to have the same impedance as a narrower trace width, and therefore allows for a lower insertion loss.

In an embodiment, the system and method for using a reference plane to control transmission line characteristic impedance allows for the use of a non-continuous (also referred to as non-solid) reference plane above and/or below the signal trace that can be used to adjust, alter, control, or otherwise establish the impedance of the transmission line. A non-continuous or non-solid reference plane can be a slotted plane, a grid plane, a plane having one or more voids, or can comprise traces, planes, or other structures above, below and/or adjacent to the signal trace. In an embodiment where the system and method for using reference plane dimensions to control transmission line characteristic impedance is implemented in a printed circuit board (PCB) in which a reference plane is located under the ASIC/package, the inclusion of a reference plane in the impedance calculation allows a narrower trace width for a given transmission line impedance, thus allowing for higher PCB routing density.

The system and method for using reference plane dimensions to control transmission line characteristic impedance will be described below as being implemented in an ASIC package or a printed circuit board and related elements. However, the system and method for using reference plane dimensions to control transmission line characteristic impedance can be implemented in any structure, including, but not limited to, laminate structures, thin and thick film ceramic structures, and any other structures that use transmission lines to transfer signals.

Figure 1:
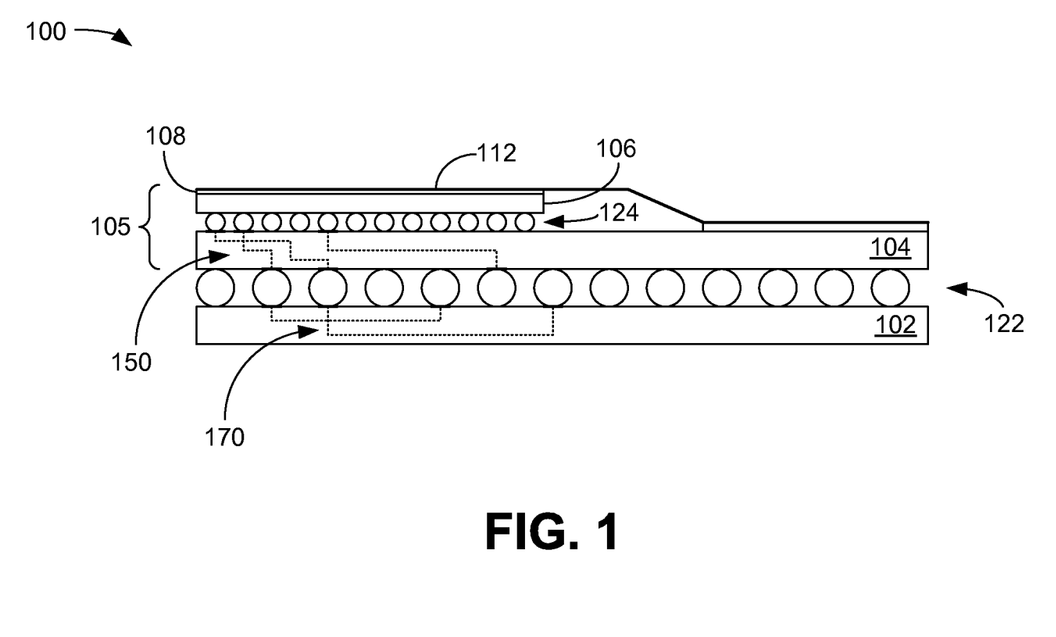
FIG. 1 is a schematic diagram illustrating a portion of an application specific integrated circuit (ASIC) assembly including transmission lines.

FIG. 1 is a schematic diagram illustrating a portion of an application specific integrated circuit (ASIC) assembly 100 in which the system and method for using reference plane dimensions to control transmission line characteristic impedance can be implemented.

The assembly 100 comprises a printed circuit (PC) board 102 over which a circuit package 105 is located and attached to the PC board 102 using solder balls 122. An example of a circuit package 105 can be a DRAM package or another circuit package. Further, the circuit package 105 can be a flip-chip package, or another circuit package as known to those skilled in the art. The PC board 102 can be any single-layer or multi-layer structure used to mount a circuit package, such as the circuit package 105 as known in the art. The solder balls 122 are an example of an attachment structure that can be used to electrically and mechanically attach the circuit package 105 to the PC board 102, and are known to those skilled in the art.

The circuit package 105 comprises a circuit element, also referred to as a "chip" 106 located and attached to a laminate structure 104 using solder bumps 124. The chip 106 generally comprises the active circuit elements of the ASIC circuitry. The solder bumps 124 are an example of an attachment structure that can be used to electrically and mechanically attach the chip 106 to the laminate structure 104, and are known to those skilled in the art. A lid 112 is attached to the circuit package 105 using an adhesive 108 as known to those skilled in the art.

The laminate structure 104 generally comprises a laminate core and one or more layers formed on one or both sides of the laminate core. The laminate structure 104 generally comprises a power distribution network and signal distribution connections, sometimes referred to as circuit traces, which transfer power and signal connections between the PC board 102 and the chip 106. Generally, the form factor and the array of solder bumps 124 of the chip 106 dictate that the connection to the PC board 102 and the array of solder balls 122 occur through an adaptive connection. The laminate structure 104 serves this adaptive connection function of coupling the chip 106 to the PC board 102, and distributing the connections between the chip 106 and the PC board 102. The laminate structure 104 generally comprises one or more power layers, ground plane (reference plane) layers, and wiring interconnects. The laminate structure 104 may also include one or more passages, referred to as "vias" that provide electrical connectivity between and among the various layers of the laminate structure 104.

In an embodiment, the laminate structure 104 may include signal traces 150 and ground, or "reference" planes (not shown in FIG. 1) and the PCB 102 may include signal traces 170 and ground, or "reference" planes (not shown in FIG. 1). The signal traces 150 and 170 can also be referred to as transmission lines and the system and method for using reference plane dimensions to control transmission line characteristic impedance can be used to control the characteristic impedance of the signal traces 150 and 170.

In the embodiment shown, the chip 106 is located over the laminate structure 104 and a periphery of the chip 106 is generally contained within the periphery of the laminate structure 104. Further, the laminate structure 104 is located over the PC board 102, and a periphery of the laminate structure 104 is generally contained within a periphery of the PC board 102.

Figure 2:
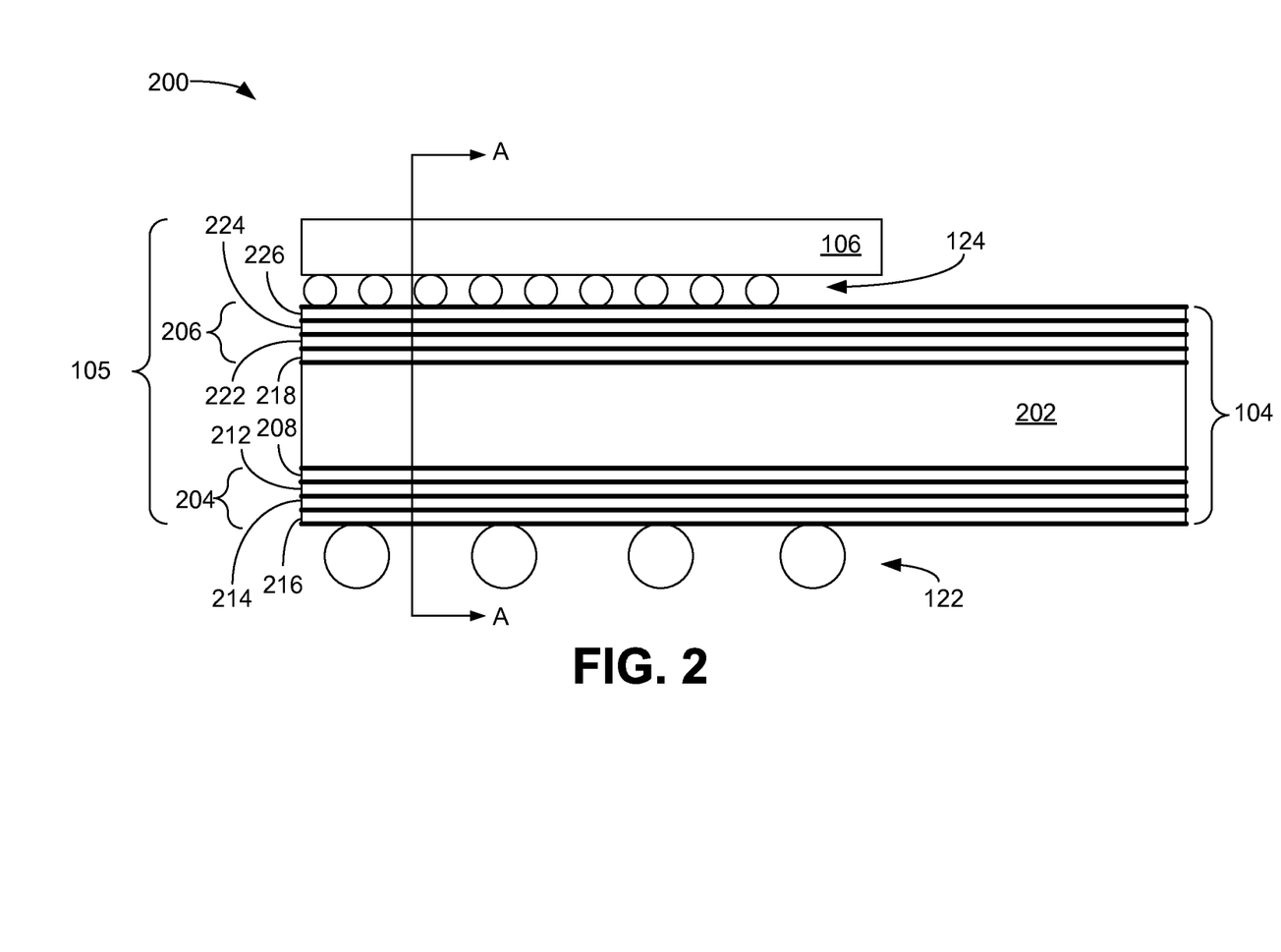
FIG. 2 is a schematic diagram illustrating a portion of the assembly of FIG. 1.

FIG. 2 is a schematic diagram illustrating a portion 200 of the assembly of FIG. 1. The portion 200 generally comprises portions of the circuit package 105, chip 106 and laminate structure 104.

The laminate structure 104 generally comprises a laminate core 202 and layers 204 and 206. For example purposes only, the laminate core 202 can be fabricated from a glass fiber material, or another suitable material known to those skilled in the art. The layers 204 and 206 are referred to as "build up" layers because they generally comprise one or more layers of dielectric material and conductive material that are "built up" on the surfaces of the laminate core 202. For example purposes only, the layers 204 comprise individual layers 208, 212, 214 and 216, and the layers 206 comprise individual layers 218, 222, 224 and 226. Each of the individual layers 208, 212, 214, 216, 218, 222, 224 and 226 may comprise a dielectric material and a conductive material. The layers 204 and 206 are illustrated as each comprising four layers, but those skilled in the art will recognize that layers 204 and 206 may comprise more or fewer layers, and may each comprise a different number of layers. The layers 204 and 206 generally include a combination of non-conductive high density dielectric material and conductive material used to construct electrical interconnects including, but not limited to, copper, or other conductive material for signal traces or other conductive material for circuit pads, conductive material for ground or reference planes, and materials for other conductive elements and structures. The conductive material is shown in bold line in FIG. 2.

FIGS. 3A through 3D are cross-sectional views of a portion of the structure of FIG. 2 taken along line A-A of FIG. 2. FIGS. 4A through 4D are cross-sectional views corresponding to FIGS. 3A through 3D, respectively, showing field capacitance between a signal trace and a reference plane.

Figure 3A:
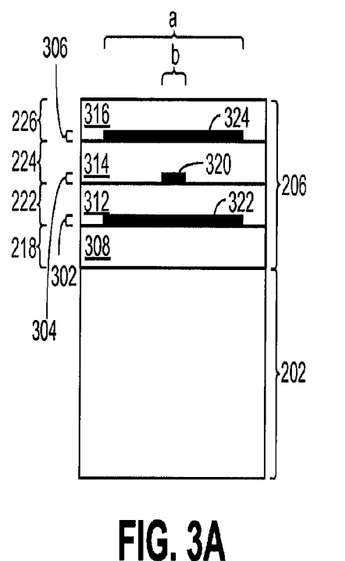
FIGS. 3A through 3D are cross-sectional views of a portion of the structure of FIG. 2 taken along line A-A of FIG. 2.

FIG. 3A shows a cross-sectional view of the layers 206 and the laminate core 202. The layers 206 are illustrated as build up layers 218, 222, 224 and 226 having dielectric material portions 308, 312, 314 and 316, and conductive layer portions 302, 304 and 306. Although shown as two distinct material portions, the build up layers 218, 222, 224 and 226 can have various distributions of dielectric material and conductive material.

In FIG. 3A, the conductive layer portion 304 comprises conductive material forming a signal trace 320, the conductive layer portion 302 comprises conductive material forming a reference plane 322, and the conductive layer portion 306 comprises conductive material forming a reference plane 324. The reference planes 322 and 324 are also referred to as ground planes. In FIG. 3A, the reference planes 322 and 324 and the signal trace 320 are approximately 15 μm (micrometers) thick, but other thicknesses are possible depending on material, process, design, and other factors. In this example, the dimension "a" refers to the width of the reference planes 322 and 324, and the dimension "b" refers to the width of the signal trace 320. In this example, the reference planes 322 and 324 are 300 μm wide and the signal trace 320 is 27 μm wide. The thickness of each of the layers 218, 222, 224 and 226 is illustratively 35 µm. The thickness of the laminate core 202 can be in the approximate range of 400-800 µm. However, all of the dimensions given herein are subject to material, process, design, and other variations.

Figure 4A:
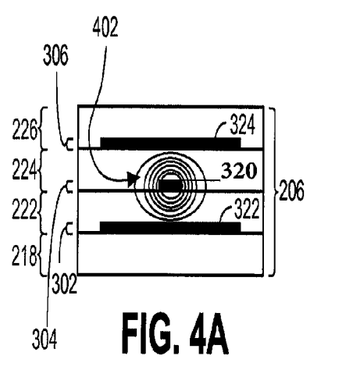
FIGS. 4A through 4D are cross-sectional views corresponding to FIGS. 3A through 3D, respectively, showing field capacitance between a signal trace and a reference plane.

In FIG. 3A, the signal trace 320 illustrates an implementation of a conductor for a "single-ended" signal in that a single conductor (the signal trace 320) alone carries an information signal. FIG. 4A shows an example of the field capacitance that occurs between the signal trace 320 and the reference planes 322 and 324. As shown by the field depiction 402, the arrangement of the signal trace 320 and the reference planes 322 and 324 results in a capacitance between the signal trace 320 and the reference planes 322 and 324 that provides an illustrative characteristic impedance of 50 ohms. The characteristic impedance Z is given by:

$$Z = \sqrt{\frac{L}{C}}$$

Therefore, decreasing the capacitance, C, results in an increased impedance, L.

Figure 3B:
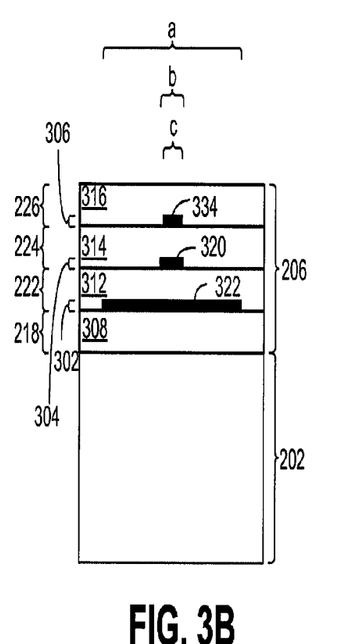
Figure 4B:
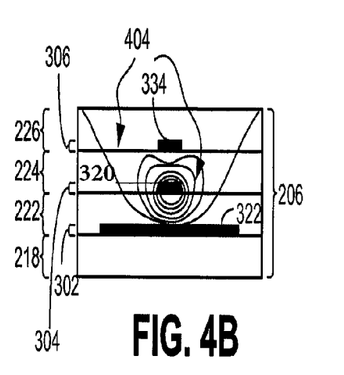

In FIG. 3B, the signal trace 320 and the reference plane 322 are similar to that shown in FIG. 3A, but the reference plane 334 has a constant thickness and a width of 20 µm (denoted as dimension "c"). Reducing the reference plane 334 to a width of 20 µm, compared to the 300 µm width of reference plane 324, reduces the capacitance between the signal trace 320 and the reference plane 334, as compared to the capacitance between the signal trace 320 and the reference plane 324 of FIG. 3A. FIG. 4B shows an example of the field capacitance that occurs between the signal trace 320 and the reference planes 322 and 334. As shown by the field depiction 404, the arrangement of the signal trace 320 and the reference planes 322 and 334 results in a capacitance between the signal trace 320 and the reference planes 322 and 334 that provides an impedance of 54 ohms. Importantly, as compared to FIG. 3A, the reduction in width of the reference plane 334 compared to reference plane 324, reduces the capacitance between the signal trace 320 and the reference plane 334, thus providing the signal trace 320 with a higher characteristic impedance with respect to the signal trace 320 in FIG. 3A, while allowing the dimensions of the signal trace 320 to remain the same. This may allow for a smaller overall dimension for the signal trace 320, while maintaining the same characteristic impedance.

Figure 3C:
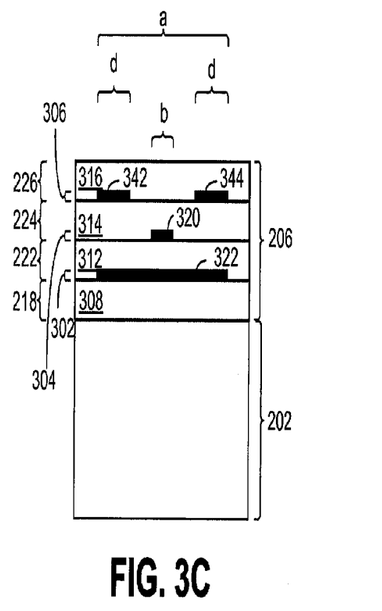

In FIG. 3C, the signal trace 320 and the reference plane 322 are similar to that shown in FIGS. 3A and 3B, but the upper reference plane includes reference plane portions 342 and 344, each having a constant thickness and a width of 50 µm (denoted as dimension "d"). Neither reference plane portions 342 and 344 are located directly opposite the signal trace 320. In this example, the reference plane portions 342 and 344 form what is referred to as a "non-continuous", a "non-solid" or a "grid" structure that allows the reference plane to be further used to influence, control, or otherwise determine the capacitance between the signal trace 320 and the reference plane portions 342 and 344, and therefore, determine the characteristic impedance of the signal trace 320. Adjusting the dimensions of the reference plane portions 342 and 344 to a width of 50 µm, compared to the 300 µm width of reference plane 324, reduces the capacitance between the signal trace 320 and the reference plane portions 342 and 344, as compared to the capacitance between the signal trace 320 and the reference plane 324 of FIG. 3A. Although shown as having the same dimensions, the reference plane portions 342 and 344 may have different dimensions.

Figure 4C:
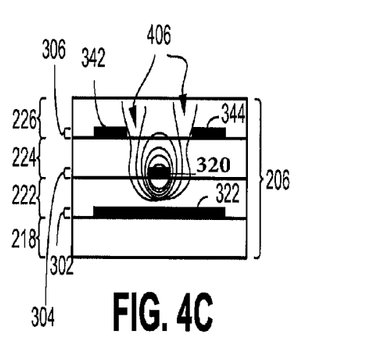

FIG. 4C shows an example of the field capacitance that occurs between the signal trace 320 and the reference plane 322 and between the signal trace 320 and the reference plane portions 342 and 344. As shown by the field depiction 406, the arrangement of the signal trace 320, the reference plane 322 and the reference plane portions 342 and 344 results in a capacitance between the signal trace 320 and the reference plane 322 and the reference plane portions 342 and 344 that provides a characteristic impedance of 62 ohms for the signal trace 320. Importantly, as compared to FIG. 3A, the combination of the reduction in width of the reference plane 324 shown in FIG. 3A to the reference plane portions 342 and 344 shown in FIG. 3C, and the non-continuous or non-solid structure of the reference plane portions 342 and 344 compared to the reference plane 324, allows for a higher characteristic impedance with reduced trace capacitance to ground for the signal trace 320.

Figure 3D:
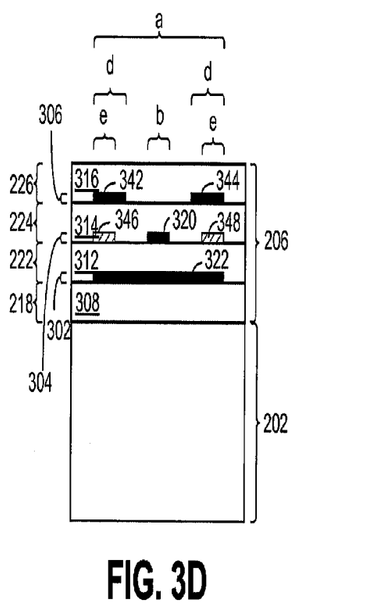
Figure 4D:
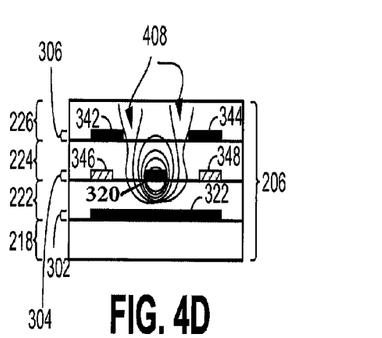

In FIG. 3D, the signal trace 320 and the reference plane 322 are similar to that shown in FIGS. 3A and 3B, and the reference plane portions 342 and 344 are similar to that shown in FIG. 3C, but additional and optional guard traces 346 and 348 are formed adjacent to the signal trace 320. The guard traces 346 and 348 can be formed from conductive material that is 15 µm thick, similar to the signal trace 320, and can be 27 µm wide (denoted as dimension "e") or can be other dimensions. The guard traces 346 and 348 can also be electrically connected to any of the reference plane 322, and reference plane portions 342 and 344, with the connection not shown in the figures for simplicity. FIG. 4D shows an example of the field capacitance that occurs between the signal trace 320 and the reference plane 322, the reference plane portions 342 and 344, and the guard traces 346 and 348. As shown by the field depiction 408, the arrangement of the signal trace 320, the reference plane 322, the reference plane portions 342 and 344 and the guard traces 346 and 348 results in a capacitance between the signal trace 320 and the reference plane 322, the reference plane portions 342 and 344 and the guard traces 346 and 348 that provides a characteristic impedance of 62 ohms for the signal trace 320. Importantly, as compared to FIG. 3A, the combination of the reduction in width of the reference plane and the non-continuous or non-solid structure of the reference plane portions 342 and 344 compared to the reference plane 324, allows for a higher characteristic impedance with reduced trace capacitance to ground for the signal trace 320.

Figure 5A:
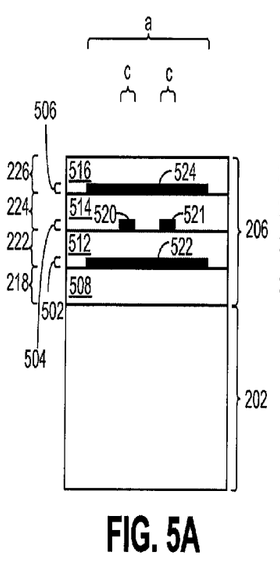
FIGS. 5A through 5C are cross-sectional views of a portion of the structure of FIG. 2 taken along line A-A of FIG. 2.
Figure 5B:
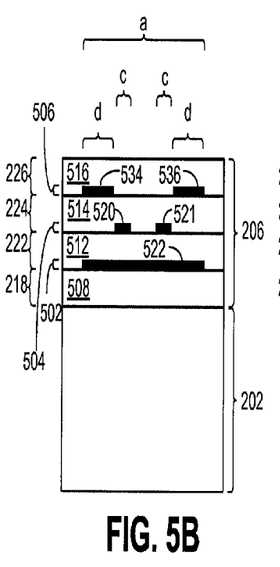
Figure 5C:
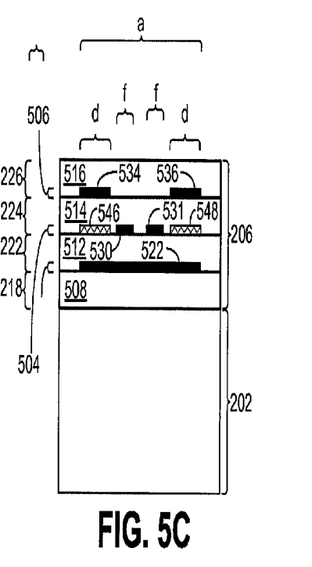
Figure 6A:
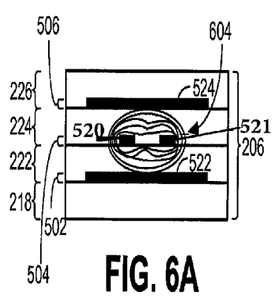
FIGS. 6A through 6C are cross-sectional views corresponding to FIGS. 5A through 5C, respectively, showing field capacitance between signal traces and a reference plane.
Figure 6B:
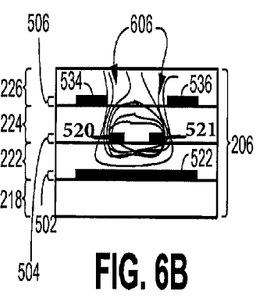
Figure 6C:
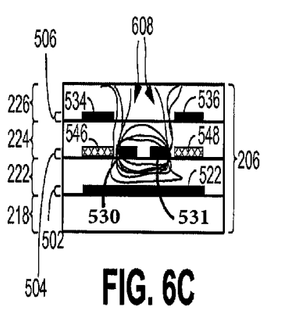

FIGS. 5A through 5C are cross-sectional views of a portion of the structure of FIG. 2 taken along line A-A of FIG. 2. FIGS. 5A through 5C illustrate an embodiment of the system and method for using a reference plane to control transmission line characteristic impedance in a differential signal implementation. FIGS. 6A through 6C are cross-sectional views corresponding to FIGS. 5A through 5C, respectively, showing field capacitance between a signal trace and a reference plane.

FIG. 5A shows a cross-sectional view of the layers 206 and the laminate core 202. The layers 206 are illustrated as build up layers 218, 222, 224 and 226 having dielectric material portions 508, 512, 514 and 516, and conductive material layer portions 502, 504 and 506. Although shown as two distinct material portions, the build up layers 218, 222, 224 and 226 can have various distributions of dielectric material and conductive material.

In FIG. 5A, the signal trace 520 and the signal trace 521 comprise the signal traces that carry the two components of a differential signal. In this example, the signal trace 520 and the signal trace 521 each have a width of 20 μm. The reference plane 522 is similar to the reference plane 322 shown in FIG. 3B and the reference plane 524 is similar to the reference plane 324 in FIG. 3A. FIG. 6A shows an example of the field capacitance that occurs between the signal traces 520 and 521, the reference plane 522 and the reference plane 524. As shown by the field depiction 604, the arrangement of the signal traces 520 and 521 and the reference planes 522 and 524 results in a capacitance between the signal traces 520 and 521, and the reference planes 522 and 524 that provides an impedance of 50 ohms.

In FIG. 5B, the signal traces 520 and 521, and the reference plane 522 are similar to that shown in FIG. 5A, but the upper reference plane includes reference plane portions 534 and 536, each having a constant thickness and a width of 50 μm (denoted as dimension "d"). Neither reference plane portions 534 and 536 are located directly opposite the signal traces 520 and 521. In this example, the reference plane portions 534 and 536 from what is referred to as a "non-continuous" a "non-solid" or a "grid" structure that allows the reference plane to be further used to influence the capacitance with respect to the signal traces 520 and 521. Adjusting the reference plane portions 534 and 536 to a width of 50 μm, compared to the 300 μm width of reference plane 524 (FIG. 5A), reduces the capacitance between the signal traces 520 and 521, and the reference plane portions 534 and 536, as described above. FIG. 6B shows an example of the field capacitance that occurs between the signal traces 520 and 521, the reference plane 522 and the reference plane portions 534 and 536. As shown by the field depiction 606, the arrangement of the signal traces 520 and 521, the reference plane 522 and the reference plane portions 534 and 536 results in a capacitance between the signal traces 520 and 521, the reference plane 522 and the reference plane portions 534 and 536 that provides an impedance of 54 ohms. Importantly, as compared to FIG. 5A, the combination of the reduction in width of the reference plane and the non-continuous or non-solid structure of the reference plane portions 534 and 536 compared to the reference plane 524, allows for a higher characteristic impedance with reduced trace capacitance to ground for the signal traces 520 and 521.

In FIG. 5C, the signal traces 530 and 531 are illustratively 28 μm wide, (denoted as dimension "f"). The reference plane 522, and the reference plane portions 534 and 536 are similar to that shown in FIG. 5B, but additional and optional guard traces 546 and 548 are formed adjacent to the signal traces 520 and 521 as shown. The guard traces can be formed from conductive material that is 15 μm thick, similar to the signal traces 530 and 531, and which can be 50 μm wide (denoted as dimension "d"), similar to the reference plane portions 534 and 536, or can be other widths. FIG. 6C shows an example of the field capacitance that occurs between the signal traces 530 and 531, the reference plane 522, the reference plane portions 534 and 536, and the guard traces 546 and 548. As shown by the field depiction 608, the arrangement of the signal traces 530 and 531, the reference plane 522, the reference plane portions 534 and 536 and the guard traces 546 and 548 results in a controllable capacitance between the signal traces 530 and 531, the reference plane 522, the reference plane portions 534 and 536 and the guard traces 546 and 548 that is controllable by controlling the dimensions and location of the reference plane portions 534 and 536.

Importantly, as compared to FIG. 5A, the combination of the reduction in width of the reference plane 534 and 536, the guard traces 546 and 548, and the wider width of signal traces 530 and 531, allows for the same 50 ohm characteristic impedance with reduced trace capacitance to ground and reduced inductances for the signal traces 530 and 531.

Figure 7A:
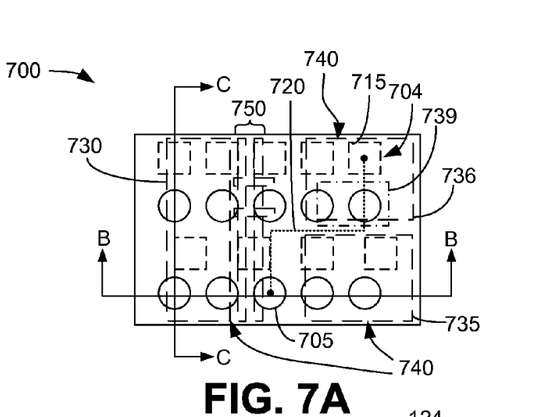
FIGS. 7A through 7C are schematic diagrams illustrating a reference plane in accordance with the embodiments described herein.
Figure 7B:
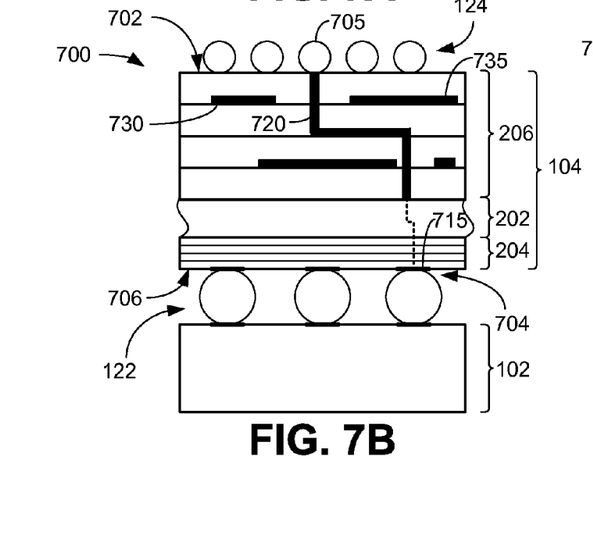
Figure 7C:
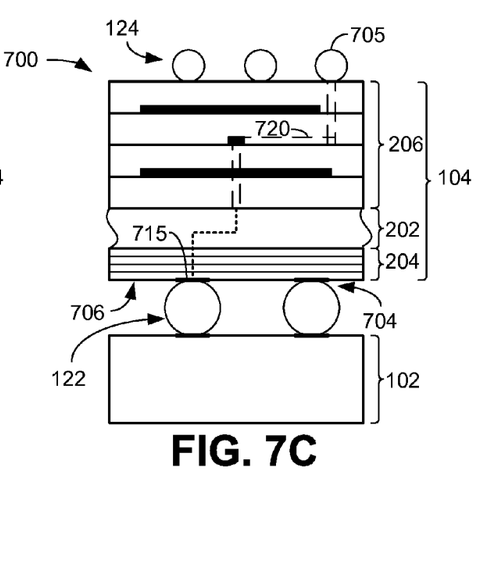

FIGS. 7A through 7C are schematic diagrams illustrating an embodiment of a reference plane in accordance with the embodiments described herein. While being described in FIGS. 7A through 7C, as being part of the laminate structure 104 (FIGS. 7B and 7C), the various embodiments of the reference planes described herein can also be fabricated as part of the printed circuit board 102 of FIG. 1, or as part of any structure having signal traces and reference planes, the capacitance between which is sought to be controlled. FIG. 7A illustrates a plan view of a portion FIG. 7A illustrates a plan view of a portion 700 of the laminate structure 104 of FIG. 1. FIG. 7B is a cross-sectional view of the structure of FIG. 7A through line B-B. FIG. 7C is a cross-sectional view of the structure of FIG. 7A through line C-C. The chip 106 is not shown for simplicity.

Solder bumps 124 (FIGS. 7B and 7C) are shown on a first surface 702 (FIG. 7B) of the laminate structure 104 and pads 704 are shown on a second surface 706 (FIGS. 7B and 7C) of the laminate structure 104 (FIGS. 7B and 7C). Details of the laminate core 202 and layers 204 are not shown for simplicity. A solder bump 705 is connected to a pad 715 by a signal trace 720. A first reference plane portion 730 (FIGS. 7A and 7B), a second reference plane portion 735 (FIGS. 7A and 7B) and a third reference plane portion 736 (FIG. 7A) comprise a non-continuous or non-solid reference plane 740 (FIG. 7A). The signal trace 720 traverses the layers 206, laminate core 202 and layers 204 to arrive at the pad 715 (FIGS. 7B and 7C). Although a single signal trace 720 is illustrated, in practice, many thousands or tens of thousands of signal traces would be part of the structure shown. The non-continuous or non-solid reference plane 740 (FIG. 7A) may comprise fewer or more than three portions 730, 735, and 736, may comprise portions having any combination of relative size and shape, may comprise one or more portions having one or more voids 739, may comprise a grid portion 750 having defined sections and voids (FIG. 7A), may comprise a noncontinuous or non-solid structure having one or more portions or sections, or may comprise any shape or structure. The grid portion may be non-uniform in that the grid portion 750 may comprise spacing, openings, lattice, or other features having non-uniform shape and spacing between the reference plane portions.

Figure 8:
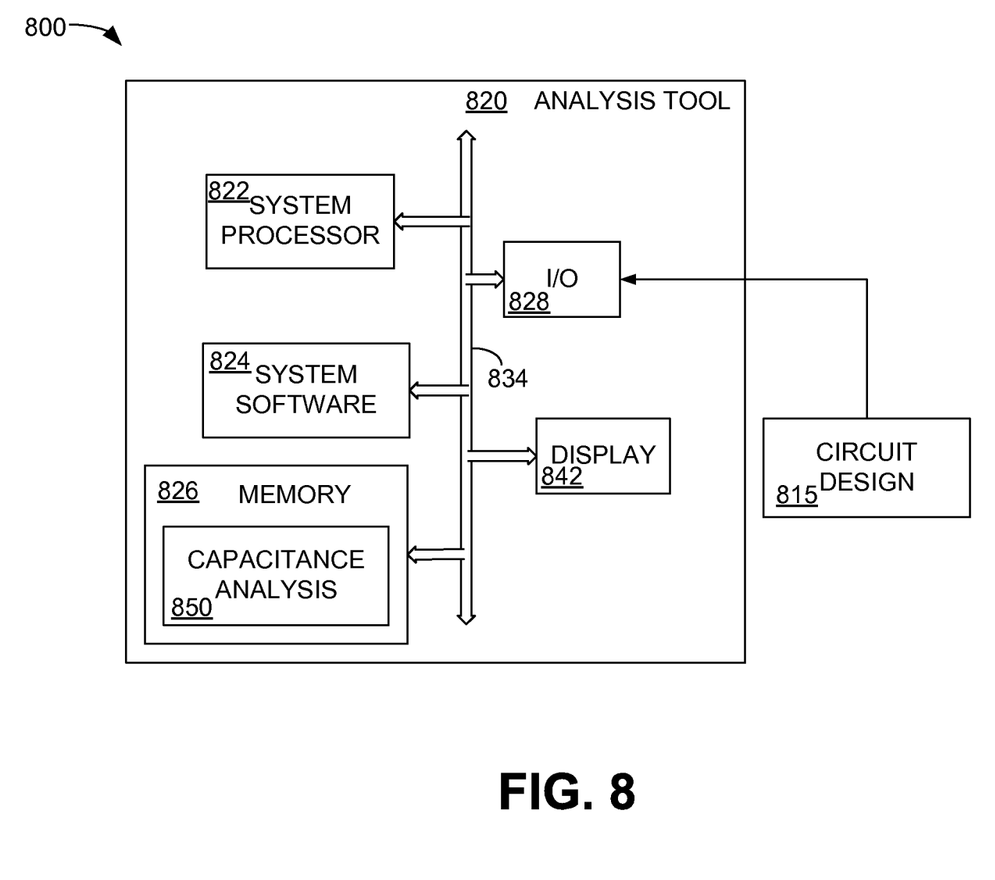
FIG. 8 is a block diagram illustrating an embodiment of a system that can be used to implement the method for using a reference plane to control transmission line characteristic impedance.

FIG. 8 is a block diagram illustrating an embodiment of a system 800 that can be used to implement the method for using a reference plane to control transmission line characteristic impedance. In an embodiment, the system 800 can comprise a circuit analysis tool 820 that can be configured to perform a variety of circuit analysis processes on a circuit design 815. In an embodiment, the circuit analysis tool 820 can be a computing system that can be configured to analyze the capacitance of signal traces and reference planes, as described herein.

The analysis tool 820 comprises a system processor 822, system software 824, a memory 826, an input/output (I/O) element 828, and a display 842 coupled together over a system bus 834. The system bus 834 can be any combination of logical and physical connections that allows bi-directional communication and interoperability between and among the connected elements.

The system processor 822 can be any general-purpose or special-purpose processor or microprocessor that is used to control the operation of the analysis tool 820. The system software 824 can contain executable instructions in the form of application software, execution software, embedded software, or any other software or firmware that controls the operation of the analysis tool 820. The memory 826 may include a capacitance analysis module 850 that can be used to analyze the capacitance of the signal traces and reference planes in the circuit design 815 and provide results on the display 842. The results can be used to further refine the reference planes as described herein to achieve the desired characteristic impedance for the signal traces.

Figure 9:
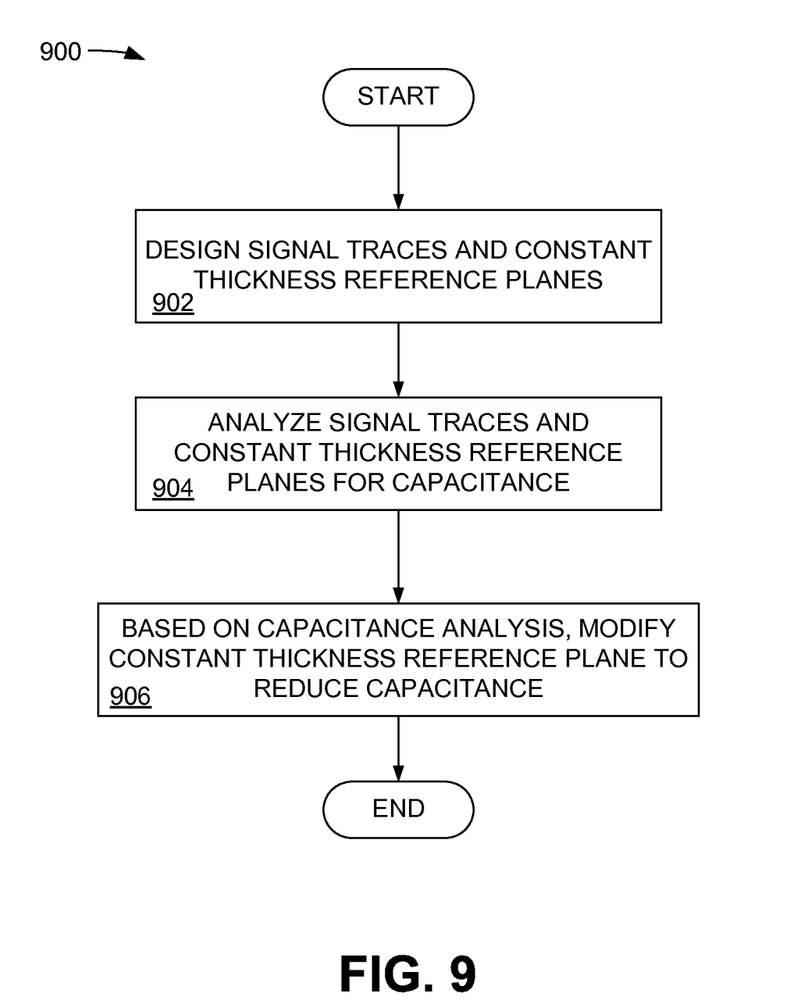
FIG. 9 is a flow chart describing the operation of an embodiment of a method for using a reference plane to control transmission line characteristic impedance.

FIG. 9 is a flow chart 900 describing the operation of an embodiment of a method for using a reference plane to control transmission line characteristic impedance. In flow chart 900, the operation begins at the START and ends at END. In block 902, a circuit design (815 of FIG. 8) is created. In block 904, the circuit design (815 of FIG. 8) is analyzed by the analysis tool (820 of FIG. 8) to determine capacitance values for the signal traces and constant thickness reference planes that are part of the circuit design 815.

In block 906, based on the capacitance analysis, one or more constant thickness reference planes are modified to achieve a desired capacitance and characteristic impedance for a signal trace.

This disclosure describes the invention in detail using illustrative embodiments. However, it is to be understood that the invention defined by the appended claims is not limited to the precise embodiments described.

What is claimed is:

1. A system for using a reference plane to control transmission line characteristic impedance, comprising:
    a signal trace located in a multi-layer structure; and
    at least two constant thickness reference planes proximate to the signal trace, wherein a first one of the at least two constant thickness reference planes is located above the signal trace, wherein a second one of the at least two constant thickness reference planes is located below the signal trace, wherein the first one of the at least two constant reference planes is a continuous structure of approximately a same width as a width of the signal trace, and
    the at least two constant thickness reference planes are located with respect to the signal trace so as to provide a desired characteristic impedance between the signal trace and the at least two constant thickness reference planes.

2. The system of claim 1, wherein at least one width dimension of the at least two constant thickness reference planes achieves a desired characteristic impedance for the signal trace.

3. The system of claim 1, wherein the signal trace is a single conductor configured to carry a single-ended signal.

4. The system of claim 1, further comprising at least one guard trace adjacent to the signal trace.

5. The system of claim 4, wherein a width dimension of two or more of the signal trace, the at least two constant reference planes, or guard trace is adjusted to control the capacitance of the system.

6. The system of claim 4, wherein the at least one guard trace adjacent to the signal trace is a same width as the as the width of the signal trace.

7. A method for using a reference plane to control transmission line characteristic impedance, comprising:
    forming a signal trace;
    forming at least two constant thickness reference planes proximate to the signal trace, wherein a first one of the at least two constant thickness reference planes is located above the signal trace, wherein a second one of the at least two constant thickness reference planes is located below the signal trace, and wherein the first one of the at least two constant reference planes is a continuous structure of approximately a same width as a width of the signal trace; and
    forming the at least two constant thickness reference planes to provide a desired characteristic impedance between the signal trace and the at least two constant thickness reference planes.

8. The method of claim 7, further comprising forming the signal trace as a single conductor configured to carry a single-ended signal.

9. The method of claim 7, further comprising selecting at least one width dimension of the at least two constant thickness reference plane portions to achieve a desired characteristic impedance for the signal trace.

10. The method of claim 8, further comprising forming at least one guard trace adjacent to the signal trace.

11. The method of claim 10, wherein a width dimension of two or more of the signal trace, the at least two constant reference planes, or guard trace is adjusted to control the capacitance of a system.

12. The method of claim 10, wherein the at least one guard trace adjacent to the signal trace is a same width as the width of the signal trace.

13. An integrated circuit assembly, comprising:
    a printed circuit board having a circuit package located thereon, any one of the printed circuit board and the circuit package having a signal trace located in a multi-layer structure; and
    at least two constant thickness reference planes proximate to the signal trace,
    the at least two constant thickness reference planes located with respect to the signal trace so as to provide a desired characteristic impedance between the signal trace and the at least two constant thickness reference planes, wherein a first one of the at least two constant thickness reference planes is located above the signal trace, wherein a second one of the at least two constant thickness reference planes is located below the signal trace, and wherein the first one of the at least two constant thickness reference planes is a structure of approximately a same width as a width of the signal trace.

14. The integrated circuit assembly of claim 13, wherein at least one width dimension of the at least two constant thickness reference plane portions achieves a desired characteristic impedance for the signal trace.

15. The integrated circuit assembly of claim 13, further comprising at least one guard trace adjacent to the signal trace.

16. The integrated circuit assembly of claim 15, wherein a width dimension of two or more of the signal trace, constant reference planes, or guard trace is adjusted to control the capacitance of the integrated circuit assembly.

* * * * *